US007676900B2

(12) United States Patent
Harmsen

(10) Patent No.: US 7,676,900 B2
(45) Date of Patent: Mar. 16, 2010

(54) APPARATUS FOR PROCESSING A CARRIER WITH ELECTRONIC COMPONENTS

(75) Inventor: Wilhelmus Hendrikus Johannes Harmsen, Wehl (NL)

(73) Assignee: Fico B.V., Duiven (NL)

( * ) Notice: Subject to any disclaimer, the term of this patent is extended or adjusted under 35 U.S.C. 154(b) by 490 days.

(21) Appl. No.: 10/579,839

(22) PCT Filed: Nov. 15, 2004

(86) PCT No.: PCT/NL2004/000798

§ 371 (c)(1),
(2), (4) Date: Mar. 7, 2007

(87) PCT Pub. No.: WO2005/060327

PCT Pub. Date: Jun. 30, 2005

(65) Prior Publication Data

US 2007/0251084 A1 Nov. 1, 2007

(30) Foreign Application Priority Data

Nov. 20, 2003 (NL) .................................. 1024819

(51) Int. Cl.
*B23P 23/00* (2006.01)
(52) U.S. Cl. ........................ 29/564.1; 29/564; 29/564.6; 29/711; 29/712

(58) Field of Classification Search .................... 29/564, 29/564.1, 564.6, 711, 827, 712
See application file for complete search history.

(56) References Cited

U.S. PATENT DOCUMENTS

| 4,362,786 | A | * | 12/1982 | Murray | 206/347 |
| 5,163,222 | A | * | 11/1992 | Imlig et al. | 29/827 |
| 5,680,699 | A | * | 10/1997 | Vos | 29/833 |
| 5,823,316 | A | | 10/1998 | Shaw et al. | |
| 6,984,974 | B2 | * | 1/2006 | Liken et al. | 324/158.1 |

FOREIGN PATENT DOCUMENTS

EP   1 251 725 A1   10/2002
WO   WO 00/05937    2/2000

* cited by examiner

*Primary Examiner*—C. J Arbes
(74) *Attorney, Agent, or Firm*—The Webb Law Firm

(57) ABSTRACT

The invention relates to an apparatus for processing electronic components mounted on a carrier, comprising at least two engaging elements which co-act when engaging on a carrier. The invention also relates to a processing element for processing electronic components mounted on a carrier, which processing element can be coupled interchangeably to an apparatus according to the invention. The invention furthermore relates to a method for product-related adjustment of such an apparatus.

14 Claims, 3 Drawing Sheets

APPARATUS FOR PROCESSING A CARRIER WITH ELECTRONIC COMPONENTS

BACKGROUND OF THE INVENTION

The invention relates to an apparatus for processing electronic components mounted on a carrier, comprising at least two engaging elements which co-act when engaging on a carrier. The invention also relates to a processing element for processing electronic components mounted on a carrier, which processing element can be coupled interchangeably to an apparatus according to the invention. The invention furthermore relates to a method for product-related adjustment of such an apparatus.

Description of the Prior Art

The processing of electronic components mounted on a carrier, and more particularly carriers with semi-conductor components such as chips connected thereto (ICs), finds wide application on an industrial scale. Particularly during the manufacture of chips such a carrier (also referred to as "lead-frame" or "board") is engaged during the storage of (semi-manufactured) products, the transport of the.(semi-manufactured) products, and the performing of a range of processes, such as for instance establishing electrical connections ("wire bounding"), encapsulating the components ("moulding"), the separating and deforming of product parts ("trimming and forming"), the testing of products and so on. Existing apparatus for processing electronic components mounted on a carrier are usually only suitable for processing carriers of a specific dimension, or they can only be modified with considerable effort in order to process differently dimensioned carriers (inter alia by removing and placing interchangeable parts depending on product dimension).

The object of the present invention is to provide an improved apparatus and method for processing electronic components mounted on a carrier, with which diversely formed products can be successively processed without considerable conversion work and conversion means being required for this purpose.

SUMMARY OF THE INVENTION

The invention provides for this purpose an apparatus for processing electronic components mounted on a carrier, comprising at least two engaging elements co-acting for engaging on a carrier, which engaging elements, depending on the dimensioning of the carrier for engaging, can be positioned in a relative orientation in adjustable manner, wherein the engaging elements are provided with at least one reference position for co-action with reference means defining the relative orientation. In order to secure a set relative orientation of the engaging elements, the engaging elements are preferably provided with securing means. The displaceable engaging elements make it possible to set the apparatus such that it is suitable for processing products (carriers with electronic components mounted thereon) with specific dimensions. Two, or more than two, engaging means which co-act when engaging on a single carrier must after all be adapted in their mutual co-action to the dimensioning of the product for engaging. The reference means herein define the dimensions for the adjustment required in the case of a determined product. In addition to the advantages of a simple, rapid and reliable product-related adjustment of the engaging means, this furthermore results in a considerable reduction in the number of product-related interchangeable parts required, which can also result in cost advantages, simplified logistics and/or reduced operating costs of the apparatus.

In a particular preferred embodiment, the apparatus is also provided with an interchangeable processing element for processing the carrier with electronic component, which processing element is provided with integrated reference means. Such a processing element can for instance consist of a moulding module, a cutting module, a cutting plate, a punch plate, a deforming module or a product holder. Apparatus with which it must be possible to process varying products are in any case usually also provided with processing elements which can be used interchangeably with the apparatus for this purpose. Because in normal conditions a processing element must already be exchanged during the conversion of an apparatus, it is additionally advantageous when the processing elements simultaneously define the dimensions (i.e. form the reference means) for the adjustment of other components of the apparatus which have a dimensioning that is product-related. With a positioning (already necessary anyway) of a product-related processing element, the engaging elements can thus be brought simultaneously into the associated relative orientation. In addition to a reduced workload, this furthermore has the advantage that there is less chance of an erroneous combination of settings. The apparatus will normally comprise a frame relative to which the engaging elements are displaceable and relative to which the processing elements are also displaceable. It is however noted here that it is on the other hand possible to also opt for the use of separate reference means.

In another preferred variant of the apparatus, the engaging elements are coupled to the frame such that the displacement of a first engaging element relative to the frame results in a forced displacement of at least a second engaging element. This can for instance be realized by assembling a plurality of engaging elements via a system of rods (rod assembly). The advantage of this preferred embodiment is that a displacement of a single (first) engaging element results in a displacement, synchronized therewith, of one or more (second) engaging elements, without particular additional attention being required for the purpose or reference means being required for the adjustment (determining the orientation) of the second engaging element.

The engaging elements can be formed by components of a conveyor, such as for instance the opposite sides of a guide path. Another possibility is that the engaging elements are formed by components of a supply container, such as for instance two or more wall parts of a supply tube.

The reference position can for instance be formed by a stop surface, a reference pin, a reference opening or a combination of such elements. For an accurate positioning of the engaging elements it is necessary that a precise (reproducible) contact can be realized between the reference means and the engaging elements. In order to increase accuracy it is advantageous, but not essential, to apply for this purpose a form-fitting co-action between the engaging elements and the reference means.

The invention also provides a processing element for processing electronic components mounted on a carrier, which processing element can be coupled interchangeably to an apparatus as described in the foregoing, wherein the processing element is provided with integrated reference means. The advantages of for instance such a mould half, cutting tool or deforming element have already been described above with reference to the apparatus according to the invention. It is expressly noted that, depending on the conditions, it is however also possible to opt for the use of separate reference means such as for instance reference plates, reference pins, and so on.

The invention moreover provides a method for product-related adjustment of an apparatus for processing electronic components mounted on a carrier as described above, comprising the processing steps of: A) selecting a reference means required for a determined adjustment of the apparatus, and B) displacing an engaging element for the product until the position of the engaging element is determined by the reference means. An apparatus for processing products is understood to mean an apparatus with which products are for instance transported, deformed, moulded, cut, but with which products can also be held in stock. Due to the method according to the invention the product-related adjustment of such an apparatus becomes very simple, is faster and requires less skill than was heretofore required for converting apparatus. This results in reduced costs and less chance of errors than in the prior art methods.

A further simplification of the converting operations can be realized when the selection of the reference means according to processing step A) takes place by selecting an interchangeable processing element for processing the carriers with electronic components with integrated reference means. In this preferred application of the method according to the present invention the (necessary) conversion of a processing element results, directly and without additional operations, in a conversion of the engaging elements. The relative position of at least two co-acting engaging elements can herein be adjusted simultaneously during processing step B).

After displacing at least one engaging element according to processing step B), the position of the displaced engaging element can be secured in a subsequent processing step C) so as to thus prevent change in a correct positioning of an engaging element.

BRIEF DESCRIPTION OF THE DRAWINGS

The present invention will be further elucidated on the basis of a number of non-limitative exemplary embodiment shown in the following figures. Herein.

DETAILED DESCRIPTION OF THE PREFERRED EMBODIMENTS

Figure 1:
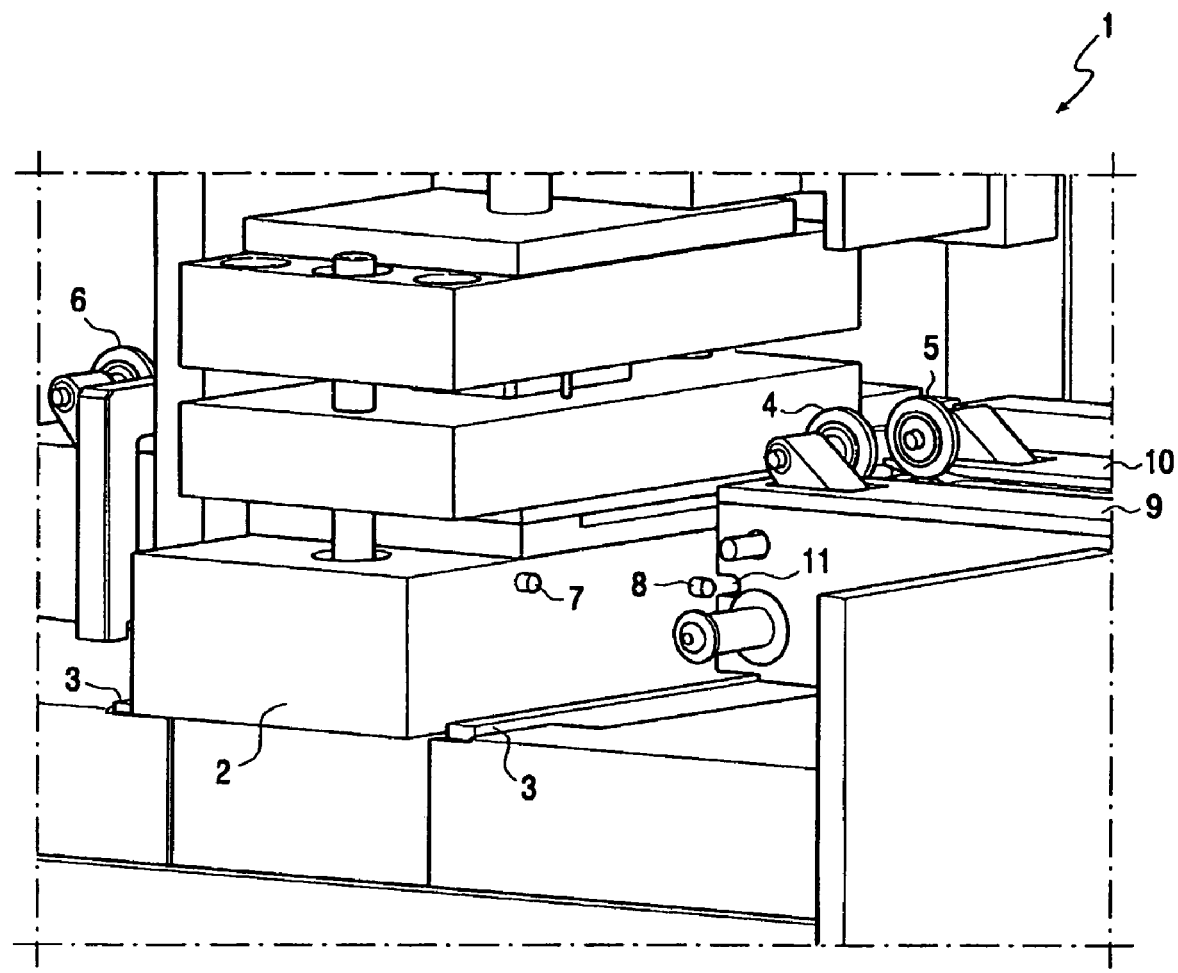
FIG. 1 shows a perspective view of a part of an apparatus according to the present invention with a tool taken partially out of the apparatus.
Figure 2:
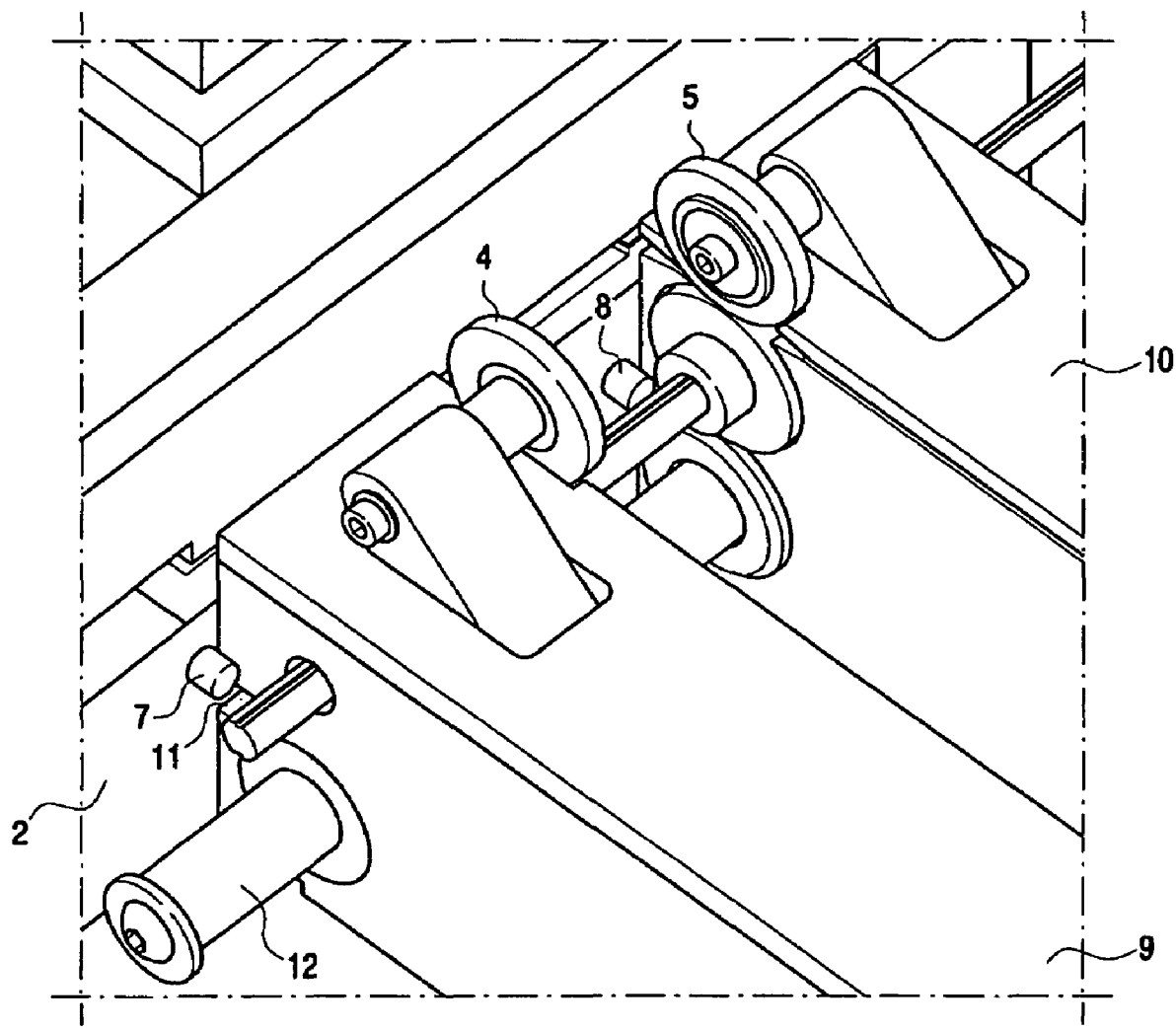
FIG. 2 shows a perspective view of a detail of the apparatus shown in FIG. 1.

FIG. 1 shows a part of an apparatus 1 for processing semiconductors mounted on lead frames, in which a tool 2 is placed partially in apparatus 1. Apparatus 1 is provided for this purpose with, among other components, guides 3 with which tool 2 can be placed accurately in apparatus 1. Also shown are transporting wheels 4, 5, 6 with which lead frames to be fed to tool 2 and removed from tool 2 can be engaged. The mutual distance between two co-acting wheels 4, 5 must be adjusted subject to the dimensions of the lead frames for transporting. According to the present invention the tool 2 is provided with reference pins 7, 8 (reference means) which, when tool 2 is placed fully in apparatus 1, co-act with wheel carriers 9, 10 which support respective wheels 4, 5. Wheel carrier 9 is herein provided with an opening 11 for passage of reference pin 8 such that reference pin 8 is made able to engage on wheel carrier 10. When tool 2 is placed fully in apparatus 1, reference pin 7 will engage on the foremost wheel carrier 7 in the figure. When reference pins 7, 8 engage on wheel carriers 9, 10, these latter are urged counter to a bias into a position in which their orientation corresponds with tool 2. This will be further elucidated with reference to FIG. 2.

FIG. 2 once again shows the tool 2 which, counter to a bias, urges wheel carriers 9, 10 rearward over a guide bar 12 by means of reference pins 7, 8. It can be seen clearly here that reference pin 7 determines the end position of the foremost wheel carrier 9, while the other reference pin 8 determines the end position of the rearmost wheel carrier 10. Reference pins 7, 8 thus determine the positions in which wheel carriers 9, 10 are placed. It will be apparent that the positions of wheel carriers 9, 10 are directly linked to the mutual distance and the position of the transporting wheels 4, 5 with which the lead frames are engaged. It can also be seen in this figure that the opening 11 is arranged in the foremost wheel carrier 9 to allow passage of reference pin 8, which in the shown situation engages on rear wheel carrier 10.

Figure 3:
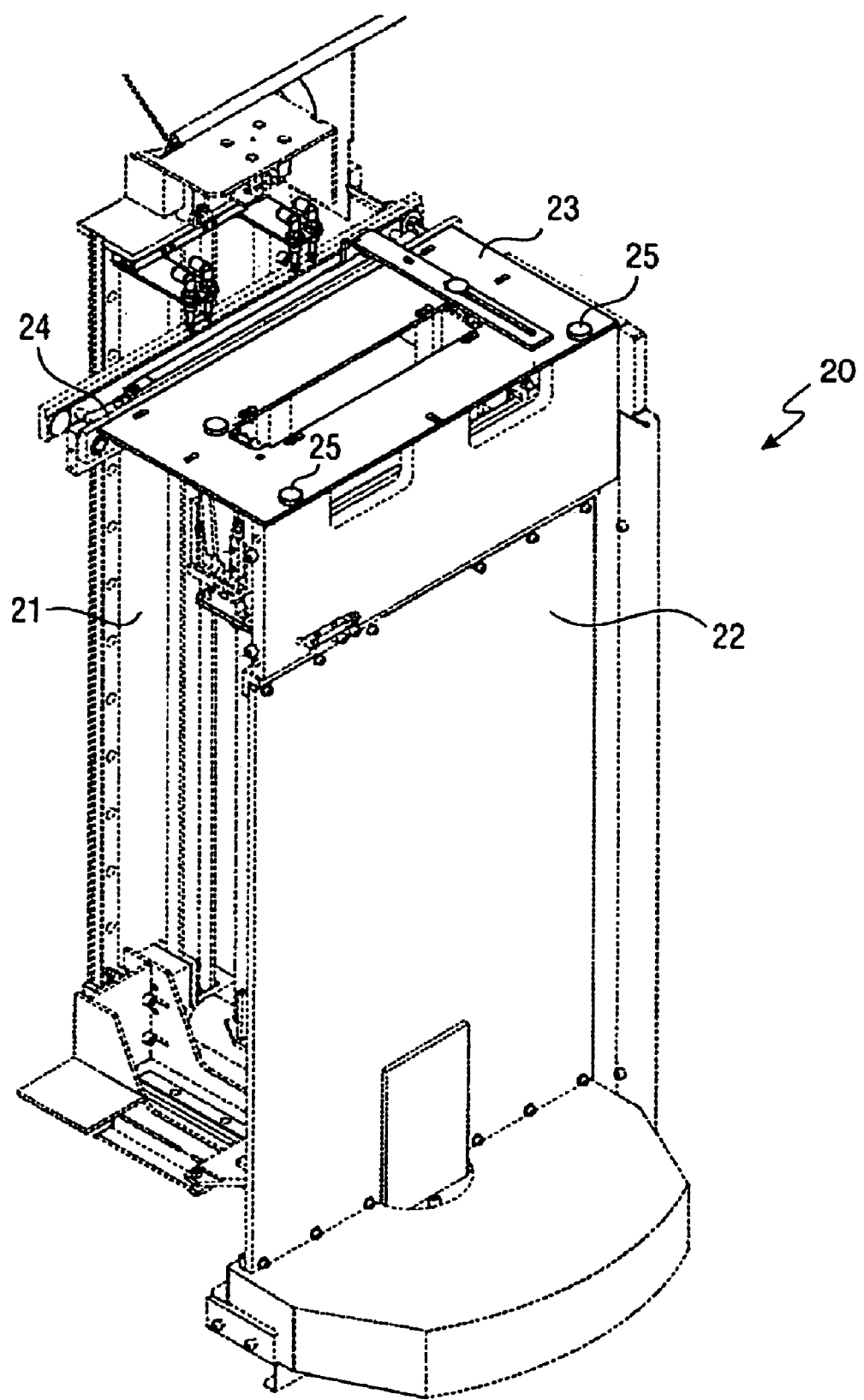
FIG. 3 shows a perspective view of a supply container for lead frames, the accommodation space of which can be adjusted by means of a likewise shown reference plate.

Finally, FIG. 3 shows a supply container 20 for lead frames with semiconductors mounted thereon, wherein the position of two opposite, upright side walls 21, 22 is determined by a reference plate 23. Reference plate 23 is provided for this purpose with a specific dimensioning. This dimensioning is determined particularly by contact surfaces 24 and/or openings 25 in reference plate 23 which function as reference dimension in adjustment of the mutual position of side walls 21, 22.

The invention claimed is:

1. An apparatus for processing electronic components mounted on a carrier, comprising:
   at least two engaging elements having a distance therebetween that is adjustable depending on the dimensions of the carrier, the at least two engaging elements engage the carrier and transport the carrier to an interchangeable processing element for processing the electronic components mounted on the carrier;
   reference means provided on the interchangeable processing element; and
   support structures for supporting the at least two engaging elements, the support structures configured to be urged counter to a bias into a position that corresponds to the interchangeable processing element,
   wherein the engaging elements are provided with at least one reference position that co-acts with the reference means to define a relative orientation.

2. The apparatus as claimed in claim 1, wherein the engaging elements are provided with securing means that co-act with the reference means for securing a set relative orientation of the engaging elements.

3. The apparatus as claimed in claim 1, further comprising a frame with the engaging elements mounted thereon,
   wherein the engaging elements are displaceable relative to the frame.

4. The apparatus as claimed in claim 3, wherein the engaging elements are coupled to the frame such that the displacement of a first engaging element relative to the frame results in a forced displacement of at least a second engaging element.

5. The apparatus as claimed in claim 1, wherein the engaging elements are formed by components of a conveyor.

6. The apparatus as claimed in claim 1, wherein the engaging elements are formed by components of a supply container.

7. The apparatus as claimed in claim 1, wherein the reference position is formed by a stop surface.

8. The apparatus as claimed in claim 1, wherein the reference position is formed by a reference pin.

9. The apparatus as claimed in claim 1, wherein the reference position is formed by a reference opening.

10. A processing element for processing electronic components mounted on a carrier, which processing element can be coupled interchangeably to an apparatus as claimed in claim 1, wherein the processing element is provided with integrated reference means.

11. A method for product-related adjustment of an apparatus for processing electronic components mounted on a carrier as claimed in claim 1, comprising the processing steps of:
   A) selecting a reference means required for a determined adjustment of the apparatus, and
   B) displacing an engaging element for the product until the position of the engaging element is determined by the reference means.

12. The method as claimed in claim 11, wherein the selection of the reference means according to processing step A) takes place by selecting the interchangeable processing element for processing the carriers with electronic components with integrated reference means.

13. The method as claimed in claim 11, wherein the relative position of at least two co-acting engaging elements is adjusted during processing step B).

14. The method as claimed in claim 11, wherein after displacing at least one engaging element according to processing step B), the position of the displaced engaging element is secured in a subsequent processing step.

* * * * *